United States Patent [19]

West et al.

[11] 4,293,815
[45] Oct. 6, 1981

[54] FLUXGATE MAGNETOMETER CIRCUIT WITH EARTH'S FIELD ELIMINATION

[75] Inventors: Jerry B. West; John L. Kretzschnar; Bing-Fai Fung, all of Tulsa, Okla.

[73] Assignee: Century Geophysical Corporation, Tulsa, Okla.

[21] Appl. No.: 901,778

[22] Filed: May 1, 1978

[51] Int. Cl.³ .................. G01R 33/04; G01V 3/26
[52] U.S. Cl. .................. 324/254; 33/312; 324/346; 364/422
[58] Field of Search .................. 324/8, 3, 254, 255, 324/256, 225, 244, 249, 253, 345, 346

[56] References Cited

U.S. PATENT DOCUMENTS

| | | | |
|---|---|---|---|
| 2,421,074 | 1/1949 | Geyger | 324/254 |
| 2,480,575 | 8/1949 | Hare | 324/254 X |
| 2,663,843 | 12/1953 | Wickerham et al. | 324/253 |
| 2,755,434 | 7/1956 | Yetter | 324/253 |
| 2,861,242 | 11/1958 | Leavitt | 324/254 |
| 2,942,179 | 6/1960 | Coker | 324/255 |
| 3,286,169 | 11/1966 | Slonczewski | 324/254 |
| 3,458,802 | 7/1969 | Koerner | 324/3 X |
| 3,568,052 | 3/1971 | Anderson | 324/253 |
| 3,622,873 | 11/1971 | Stine | 324/249 |
| 3,657,641 | 4/1972 | Kardashian | 324/249 |
| 3,679,969 | 7/1972 | Fussell | 324/244 |
| 3,686,581 | 8/1972 | Takeda et al. | 324/253 X |
| 3,686,581 | 8/1972 | Takeda et al. | 324/253 X |
| 3,971,981 | 7/1976 | Nakagome et al. | 324/254 |
| 3,983,475 | 9/1976 | Watanabe et al. | 324/254 |

OTHER PUBLICATIONS

Geyer, William A., "*The Ring-Core Magnetometer...*", AIEE Transac. Communications & Electronics, vol. 81, pt. 1 #59 Mar. 1962, pp. 65-73.

*Primary Examiner*—Gerard R. Strecker
*Attorney, Agent, or Firm*—Richards, Harris & Medlock

[57] ABSTRACT

A flux gate magnetometer system utilizes three independent flux gates for measuring the three mutually orthogonal components of the earth's magnetic field. A sensor for each flux gate includes a ring core with a toroidal winding as the drive winding and a differential winding for sensing the difference in saturation due to the earth's flux linkages in the core. The operation of the flux gate magnetometer system is stabilized by a second harmonic servo type null circuit. The output of the differential sense winding is beat with a signal twice the frequency of the drive signal and in phase with the sensor output. This demodulated signal is the error signal for an integration stage. The integration stage drives a high impedance current source which sums into the flux gate sense winding and eliminates the effect of the earth's field in the sensor. An error signal is generated only when the high impedance current source does not null the earth's flux linkages in the core. The flux gate magnetometer system provides a means for determining the components of the earth's magnetic field for use in a digital mineral logging system.

4 Claims, 12 Drawing Figures

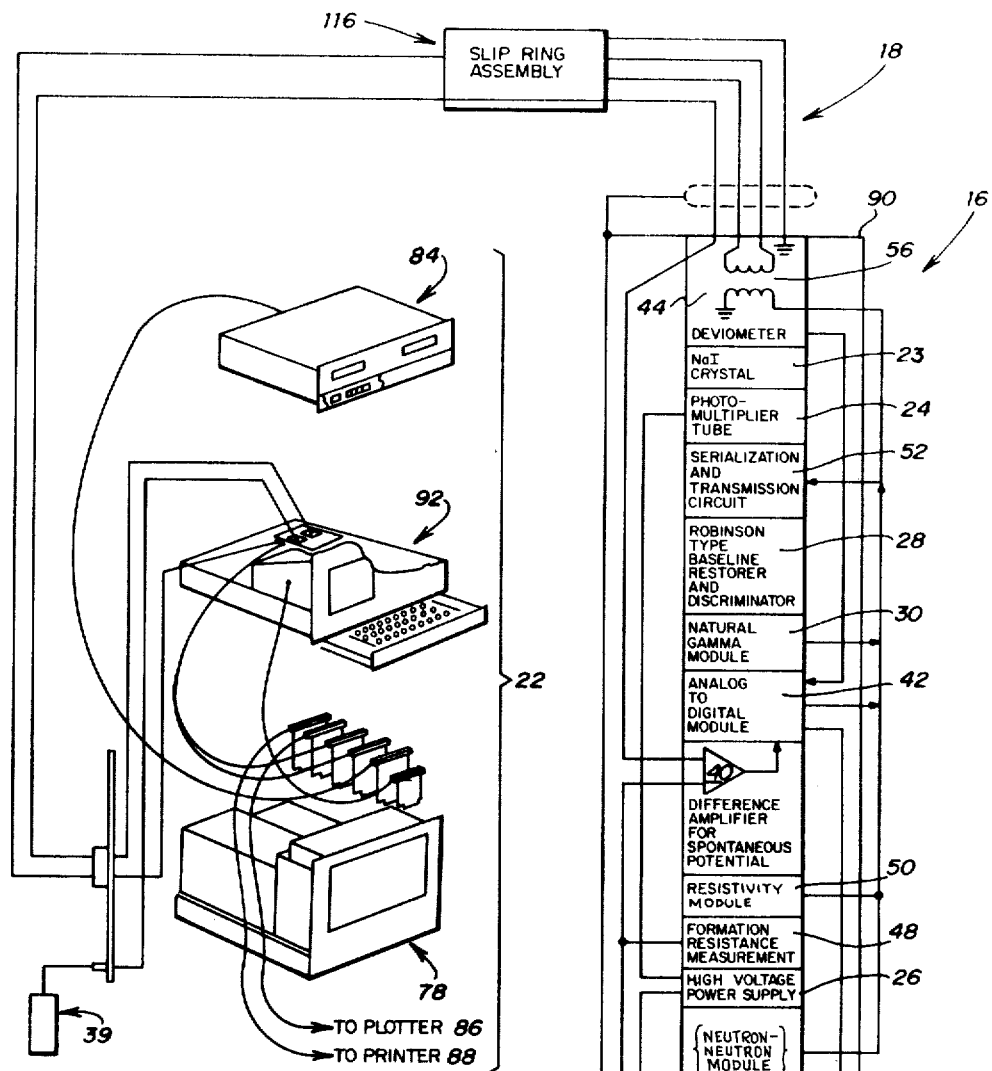
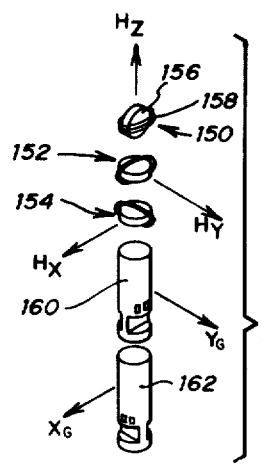
FIG. 4
FIG. 5

FLUXGATE MAGNETOMETER CIRCUIT WITH EARTH'S FIELD ELIMINATION

FIELD OF THE INVENTION

This invention relates to flux gate magnetometer systems, and more particularly it relates to the stabilization of a flux gate magnetometer by utilizing a high impedance current source fed back into the sense winding to eliminate the effect of the earth's field in the sensor and achieve a stable null point of operation.

DESCRIPTION OF THE PRIOR ART

The detection and evaluation of subsurface mineral deposits typically involves drilling an exploratory borehole deep into the surface of the earth. A borehole may typically be drilled to a depth of up to 6,000 feet, or even deeper. The borehole is then probed by lowering a mineral logging tool to the bottom of the borehole to gather the necessary information for the location of ore deposits and for lithological studies.

The more information that can be derived from a single pass of the mineral logging tool through the borehole reduces the cost of obtaining a unit of data. Reruns of the mineral logging tool are undesirable, because they increase the idle time for expensive drilling equipment. In addition, if repeated passes of the mineral logging tool are required to obtain the necessary information, the risk of redrilling the borehole increases, since mineral logging typically involves boreholes that do not survive for any extended period of time.

Deviation data is one piece of information obtainable from a mineral logging run which is useful to geologists and log analysts in locating and evaluating ore deposits. Deviation data provides a means for calculating the true path of the borehole through the ore formation. Prior art mineral logging systems typically derive such deviation data on a second pass of a deviation sensor through the borehole. Other mineral log sensors often requiring a separate pass in prior logging systems include natural gamma sensors, spontaneous potential sensors, resistivity sensors and neutron-neutron porosity sensors.

Prior art mineral logging information processing and transmission techniques for deviation sensor information, as well as for other sensors, utilizes conventional analog equipment with the common channel and band width limitations arising from the use of such equipment. Such prior art analog systems also experience a problem in the distortion of data arising from the inevitable lag or time constant that exists in all analog systems. Such prior art mineral logging systems commonly require data accumulation at the bore site, the data then being transported to a remote data processing station for processing and analyses. Such techniques require a substantial time lapse before meaningful information is available at the bore site.

Flux gate magnetometer systems are utilized in such mineral logging tools to derive the necessary deviation data according to well recognized formulas. Such systems operate to produce a DC voltage proportional to the magnitude of the component of the earth's magnetic field normal to the pick up coil. However, such systems have stability problems at that point due to the temperature dependent core characteristics, amplifier tuning and other factors effecting the transfer function of the magnetic field to voltage. Previously, some magnetometer systems have been stabilized by using a manually operated null system applied to a single flux gate.

A need has thus arisen for a servo type null feedback system to stabilize the operation of flux gate magnetometer systems. A need has also arisen for an improved mineral logging system utilizing multiple sensors within a single mineral logging tool, for gaining all the necessary logging information, including deviation data, in a single pass through the borehole. A further need has arisen for an improved mineral logging system which is operable at higher logging speeds, and a mineral logging tool which derives all data in digital format within the borehole for improved accuracy. An additional need has arisen for a self-identifying borehole logging tool which can be used to check the identity of a particular logging tool as well as to check for errors in the telemetry system. And further, a need exists for a logging system having the above-noted features which provides data accumulation, processing and reporting on a substantially real time basis at the bore site, thus allowing drilling corrections to be made in a timely manner.

SUMMARY OF THE INVENTION

The present invention provides a stabilized flux gate magnetometer for use in a mineral logging tool of a digital mineral logging system to obtain an accurate logging of data. The mineral logging tool houses a plurality of sensors for obtaining all the desired logging data in a single pass of the logging tool through the borehole site in the formation.

In accordance with the present invention, a flux gate sensor generates an error signal detected by a sense winding, the amplitude of the error signal being proportional to the magnitude of the component of the earth's magnetic field and having a frequency which is the second harmonic of the sensor's excitation signal. A phase detector generates a rectified signal containing information of the amplitude and phase of the sense winding. Integrating circuit means is provided for generating a DC voltage signal of a magnitude and polarity determined by intensity and direction of the component earth's magnetic field. A high impedance current means is provided for flowing a DC current signal through the sense winding to eliminate the effect of the earth's magnetic field in the sensor without loading the sense winding.

BRIEF DESCRIPTION OF THE DRAWINGS

For a more complete understanding of the present invention and further advantages thereof, reference is now made to the following description taken in conjunction with the following drawings:

FIG. 4 is a block diagram view of the multiple sensors of the mineral logging tool of FIG. 2 shown interfacing with the surface components of the digital mineral logging system;

FIG. 5 is an exploded view of the sensors housed within the deviometer;

DESCRIPTION OF THE PREFERRED EMBODIMENT

Truck-Borne Digital Mineral Logging System

Figure 1:
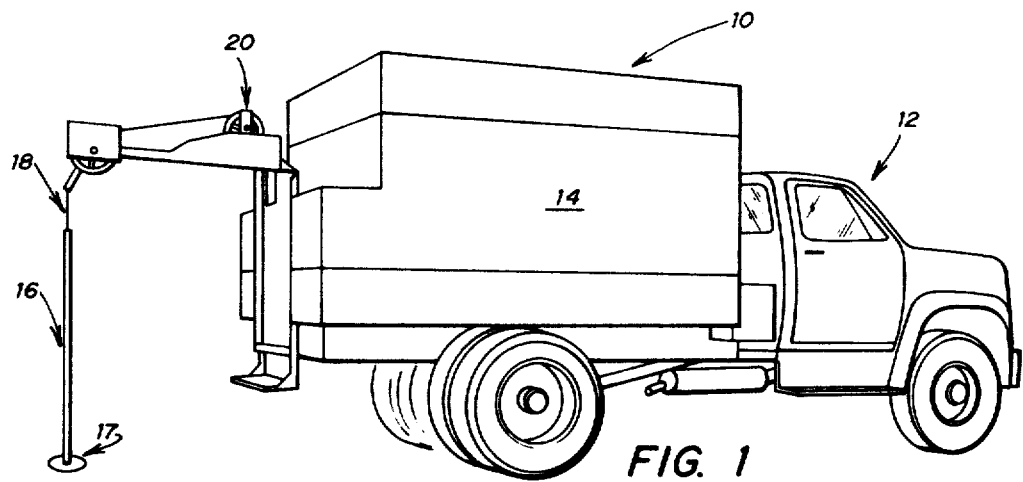
FIG. 1 is a perspective view of the truck-borne mineral logging system of the present invention with a logging tool shown in the raised position at the rear of the truck.

FIG. 1 is a perspective view of the digital mineral logging system 10 of the present invention mounted upon a truck 12 for transporting the complete digital mineral logging system 10 to a borehole site. The operator controls for the digital mineral logging system 10 are housed entirely within a truck instrument cab 14, thereby enabling geologists and log analysts to operate the logging system 10 from within the cab 14.

A mineral logging tool 16 is shown suspended by a cable 18 from a winch system 20 which is cantilevered upon the rear of the truck 12. The tool 16 is shown in the raised position above a borehole 17 at the beginning of a mineral logging run. The tool 16 is lowered by the cable 18 and the winch 20 to the depth within the borehole 17 where the mineral logging run is to begin. Normally, the mineral logging tool 16 is lowered to the bottom of the borehole 17. Boreholes for typical mineral logging operations may extend to a depth of 6,000 feet or even greater. The tool 16 of the mineral logging system 10 transmits digitized mineral logging data as the tool 16 is being withdrawn from the borehole 17 at rates of 30 to 100 feet per minute. This digital information is then demodulated, recorded and later processed by the surface components 22 (see FIG. 3) of the system 10 housed within the trailer 14.

Block Diagram of a Mineral Logging Tool

Figure 2:
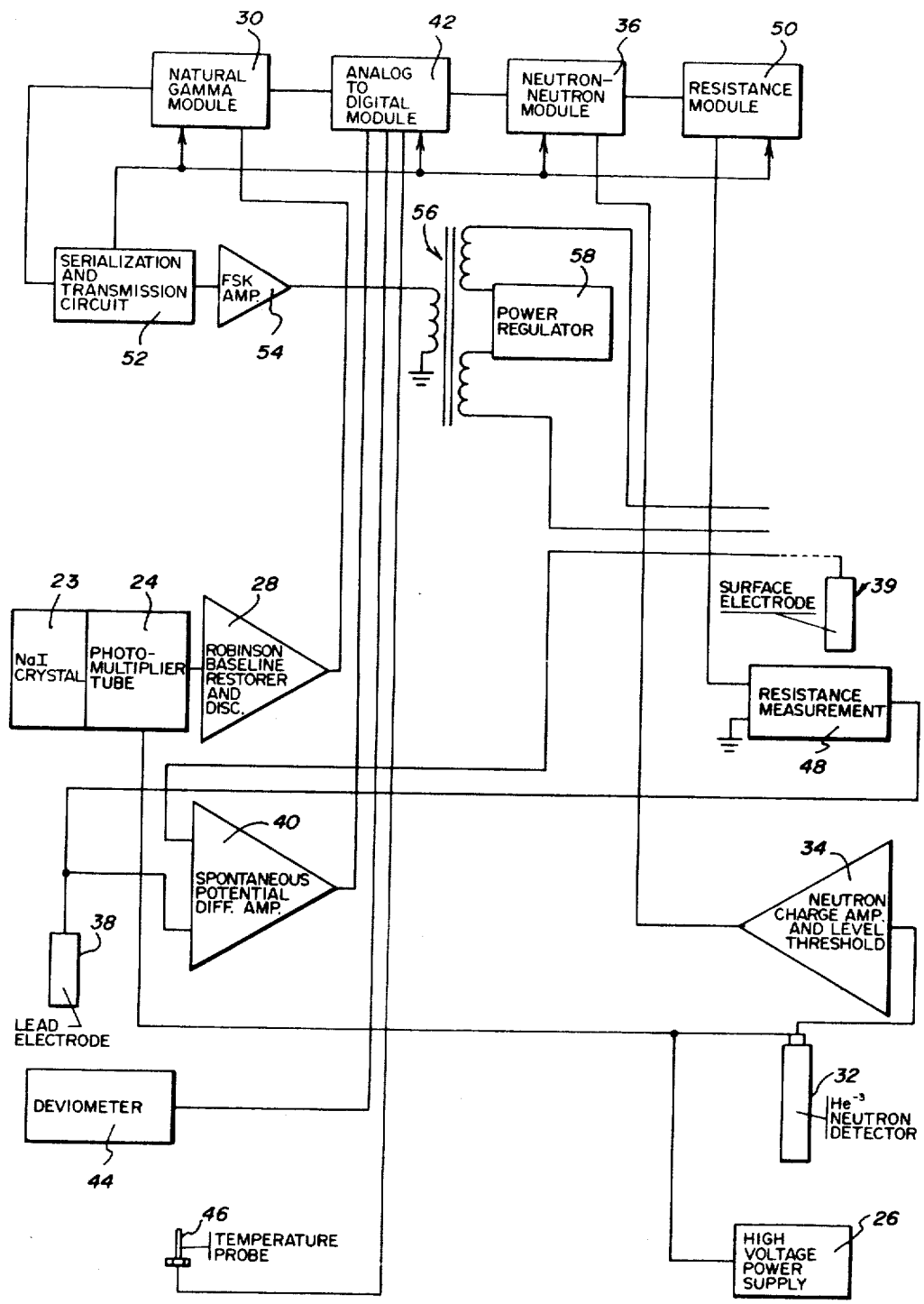
FIG. 2 is a block diagram of a borehole logging tool.

FIG. 2 is a block diagram illustration of the multiple sensors and associated circuitry housed in the mineral logging tool 16. The selected combination of sensors of tool 16 provides data on the natural gamma count, neutron-neutron porosity, spontaneous potential, temperature, borehole deviation, and resistance.

The natural gamma information is useful both for the location of ore deposits such as coal and uranium, and for lithological studies. A sodium iodide scintillation crystal 23 is optically coupled to a photomultiplier tube 24 for acquiring the natural gamma information. A high voltage power supply source 26 energizes the photomultiplier tube 24. The signal from the photomultiplier tube 24 is driven into a Robinson-type baseline restorer 28 where the signal is threshold discriminated. The digital signal from the baseline restorer 28 is then accumulated in the natural gamma module 30.

The neutron-neutron porosity data is useful in the determination of formation porosity and for lithologic studies. The high voltage power supply 26 energizing the photomultiplier tube 24 also energizes a neutron detector tube 32. The neutron detector tube 32 produces a charge which is driven into a neutron amplifier and threshold discriminator 34. The digital signal from the amplifier and discriminator 34 is then accumulated in the neutron-neutron module 36.

The logging tool 16 also measures spontaneous potential, temperature and deviation data for locating and evaluating ore formations. The spontaneous potential information shows the natural electrical potential between a lead electrode 38 on the logging tool 16 and a surface reference electrode 39. The spontaneous potential amplifier 40 amplifies the data and transmits it to an analog to digital module 42. A five parameter deviometer 44 also transmits the borehole deviation measurements to the analog to digital module 42. The five separate parameters measured include two orthogonal gravitational measurements made along the axis of the device, along with three mutually orthogonal components of the earth's magnetic field with known axis relationship to the gravitational axis. Finally, a temperature probe 46 continually transmits a temperature signal to the analog to digital module 42.

The analog to digital module 42 determines the sequence the analog signals from the spontaneous potential amplifier 40, the five parameters of deviometer 44 and the temperature probe 46 are converted to a digital signal for each transmission of data to the surface components 22. The module 42 also inserts a signal address into the data stream for absolute signal identification.

The logging tool 16 also includes a sensor for measuring the formation resistance, which is useful in the detection of coal and in lithologic studies. A resistance measurement circuit 48 measures the formation resistance by measuring the resistance between the lead electrode 38 and ground. The data from the resistance measurement circuit 48 is transmitted to a resistance module 50 to be serial transmitted along with the rest of the data upon command from the control logic.

In the preferred embodiment, the batch transmission of the serialized data occurs at a 10 hertz sampling rate. A serialization and transmission control circuit 52 samples the data from the natural gamma module 30, analog to digital module 42, neutron-neutron module 36, and resistivity module 50 every 100 milliseconds, transmitting it to the surface at a 2400 baud rate. The serialization and transmission control circuit 52 also inserts an identification code for the particular logging tool 16 to the beginning of the data stream from the modules 30, 36, 42 and 50, and the circuit 52 converts this stream of data to a dual frequency FSK (frequency shift key) signal for transmission up the d-c power lines. This dual frequency FSK transmission signal is driven onto the power lines by FSK amplifier 54 and transformer 56. Power regulator circuit 58 bypasses the circuit impedance and provides regulated power to the electronics in the logging tool 16.

It is understood that the digital mineral logging system 10 of the present invention is not limited to the selection or arrangement of sensors illustrated in the logging tool 16. The availability of a digital processing unit at the borehole site makes possible other useful new mineral logging tools. As an example, the mineral logging system 10 may have a logging tool including sensors for determining gamma gamma density, gamma energy spectrometry and delayed fission neutron measurements. In addition, the tool may be equipped with a caliper for measuring the borehole diameter. The borehole diameter is often used in conjunction with the gamma gamma density to identify washouts in the formation which is important in the interpretation of the density data.

Block Diagram of the Digital Processing Unit

Figure 3:
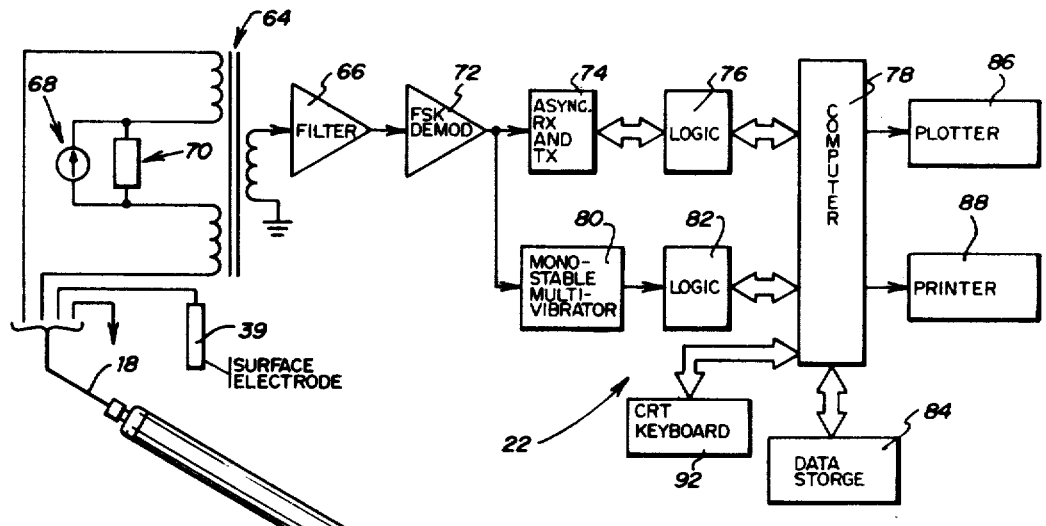
FIG. 3 is a perspective view of the logging tool together with a block diagram of the truck-borne surface components of the digital mineral logging system.

FIG. 3 is a perspective view of the logging tool 16 connected through the four conductor armored cable 18 to the truck-borne surface components 22. One conductor of the cable 18 is tied to ground, and a second conductor is attached to the surface electrode 39 for measuring the natural electromagnetic potential between the lead electrode 38 of the logging tool 16 and the surface electrode 39. The surface electrode 39 can be placed in a mud pit located at the borehole site 17 for obtaining the reference surface voltage.

The remaining two leads of the cable 18 extend from the transformer 56 (shown in FIG. 2) transmitting the logging data from the tool 16 to the surface components 22. A pulse transformer 64 decouples the logging data from the power lines of cable 18 to an active pass filter 66. In addition to carrying the dual frequency FSK transmitted logging data, the power lines of the cable 18 transmit d-c electrical power to the circuits of the logging tool 16 through a current source 68, including a current source bypass 70. In practice, a 250 milliampere current source 68 is provided to energize the circuits of the logging tool 16 illustrated in FIG. 2 and described hereinabove.

The FSK signal is conditioned by the band pass filter 66 encompassing the dual FSK frequencies and it is then demodulated into a serial data stream by an FSK phase lock loop demodulator 72. This serial data stream is then fed into a universal asynchronous receiver and transmitter 74 which is interfaced through logic interface unit 76 to a digital computer 78. A monostable multivibrator 80 uses the first byte of serial data from FSK demodulator 72 to trigger a computer interface logic 82 of the digital computer 78.

During the recording phase, the data from the digital computer 78 is stored in a data storage medium 84, such as a magnetic tape unit. In the calculating, plotting and printing phase, the stored data from the storage medium 84 is processed by the computer 78 which displays the logging data utilizing a digital plotter 86 or a printer 88, or both, and computer 78 is interfaced with CRT unit 92. Of course, other electronic digital signal processing means could be used to perform the computation performed by computer 78.

Organization of the Sensors in the Mineral Logging Tool

FIG. 4 is a block diagram view of the multiple sensors physically positioned in the logging tool 16 and interfaced with the surface components 22 of the digital mineral logging system 10. Beginning with the end of the logging tool 16 opposite from the cable 18, a one millicurie Americium Beryllium neutron source 110 is an isotopic neutron source in the logging tool 16 for obtaining the neutron-neutron porosity of the formation. The Americium Beryllium source 110 is located a predetermined minimum distance from the sodium iodized scintillation crystal 23 to prevent erroneous gamma detection. A neutron spacer 112 separates the neutron source 110 from the remainder of the sensors in the tool 16.

The neutron count returned to the logging tool 16 by the formation from the neutron source 110 is detected by the neutron detector 32. The neutron detector 32 reacts with individual thermal neutrons producing a charge which is amplified and threshold discriminated by the neutron amplifier 34. This digital signal for the neutron count is accumulated in the neutron-neutron module 36. The neutron detector 32 should be fixed within the logging tool 16 to be a predetermined distance away from the AmBe neutron source 110, which distance for the logging tool 16 is found to be at least seventeen inches. The neutron detector 32 operates with a high negative potential from the high voltage power supply 26, which also energizes the photomultiplier tube 24.

A thermistor 114 is positioned adjacent the neutron spacer 112 as part of the temperature probe 46 illustrated in FIG. 2. The thermistor 114 is connected to the analog to digital module 42. The module 42 multiplexes the analog temperature signal and then converts it to a digital signal. The analog to digital module 42 also addresses the signal for absolute signal identification upon transmission of the logging data to the surface.

The resistance measurement circuit 48 measures the formation resistance by measuring the resistance between the lead electrode 38 and the ground some distance up the cable from the electrode. The formation resistance measurement is then transmitted to the resistivity module 50 as part of the data stream for the serialization and transmission control circuit 52.

The lead electrode 38 is also utilized by the spontaneous potential differential amplifier 40 to measure the natural electric potential between electrode 38 and the surface reference electrode 39. The differential amplifier 40 transmits the measurement of the spontaneous potential to the analog to digital module 42 for digitizing the spontaneous potential data within the logging tool 16. Measurement of the spontaneous potential within the logging tool 16 eliminates the sheath currents in analog readings and achieves a greater self potential noise rejection than was possible with previous systems utilizing an analog reading at the surface. Finally, a plastic covering 90 insulates the logging tool 16 for more accurate resistance and self potential measurements.

The sodium iodide scintillation crystal 23 is spring-loaded against a photomultiplier tube 24 for obtaining the information for the natural gamma module 30. The photomultiplier tube 24 operates with a high negative potential from the high voltage power supply 26. Thus, the photomultiplier tube 24 and the helium 3 neutron detector 32 are operated with their cathode at a negative potential from a common high voltage power supply. The signal from the photomultiplier tube 24 is driven into the Robinson-type baseline restorer and threshold discriminator 28. The digital signal from the discriminator circuit 28 is then counted in a digital accumulator and serialized in the natural gamma module 30.

The five parameter deviometer 44 is positioned then as the sensor nearest the point where the cable 18 attaches to the mineral logging tool 16. The deviometer 44 transmits the borehole deviation measurements to the analog to digital module 42. The multiplexer in the module 42 determines the sequence for converting the analog signals to digital format. Finally, the data from natural gamma module 30, neutron-neutron module 36, analog to digital module 42 and resistivity module 50 are sampled at a 10 Hz rate and transmitted at a 2400 baud rate by the serialization and transmission control circuit 52. Circuit 52 adds the identification code to the beginning of the data stream for that particular tool 16 and converts the data to a dual frequency FSK format for transmission. The signal is then driven onto the power lines of the cable 18 through the transformer 56. A slip ring assembly 116 connects the power lines of the cable 18 to the surface components 22.

The surface components 22 of the digital mineral logging system 10 include the data storage medium 84 for recording all of the mineral logging data during the recording phase.

A CRT display and keyboard unit 92 is interfaced with the digital computer 78, and allows the operator to interact with the mineral logging system 10. Current borehole data can be displayed on the CRT of the unit 92, as well as operator directives, warnings, etc., and operator responses to various types of alpha-numeric data may be entered from the keyboard. The CRT display and keyboard unit 92 also includes the downhole power supply unit and a strain monitor for measuring the weight on the logging cable 18. Thus, the strain monitor enables the operator to determine that the logging tool 16 has contacted the bottom of the borehole 17 for initiating the uphole pass of the tool 16.

The digital computer 78 is shown interfaced with the CRT display and keyboard unit 92 and the digital plotter 86 and printer 88. A Texas Instruments Model 960B digital computer can be used as the electronic digital signal processing means for the mineral logging system 10 of the present invention.

DEVIOMETER SENSORS

Figure 6:
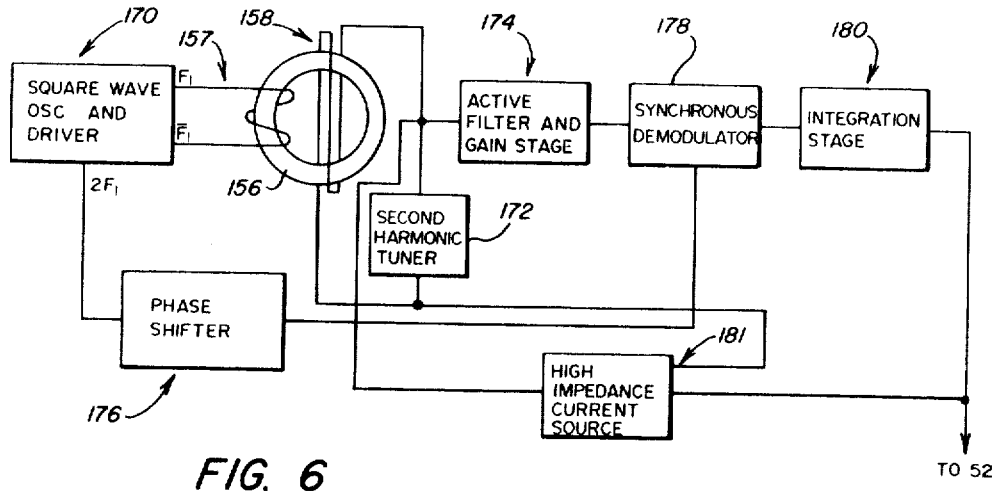
FIG. 6 is a block diagram view of the flux gate circuitry for one flux gate of the deviometer located within the mineral logging tool.
Figure 7:
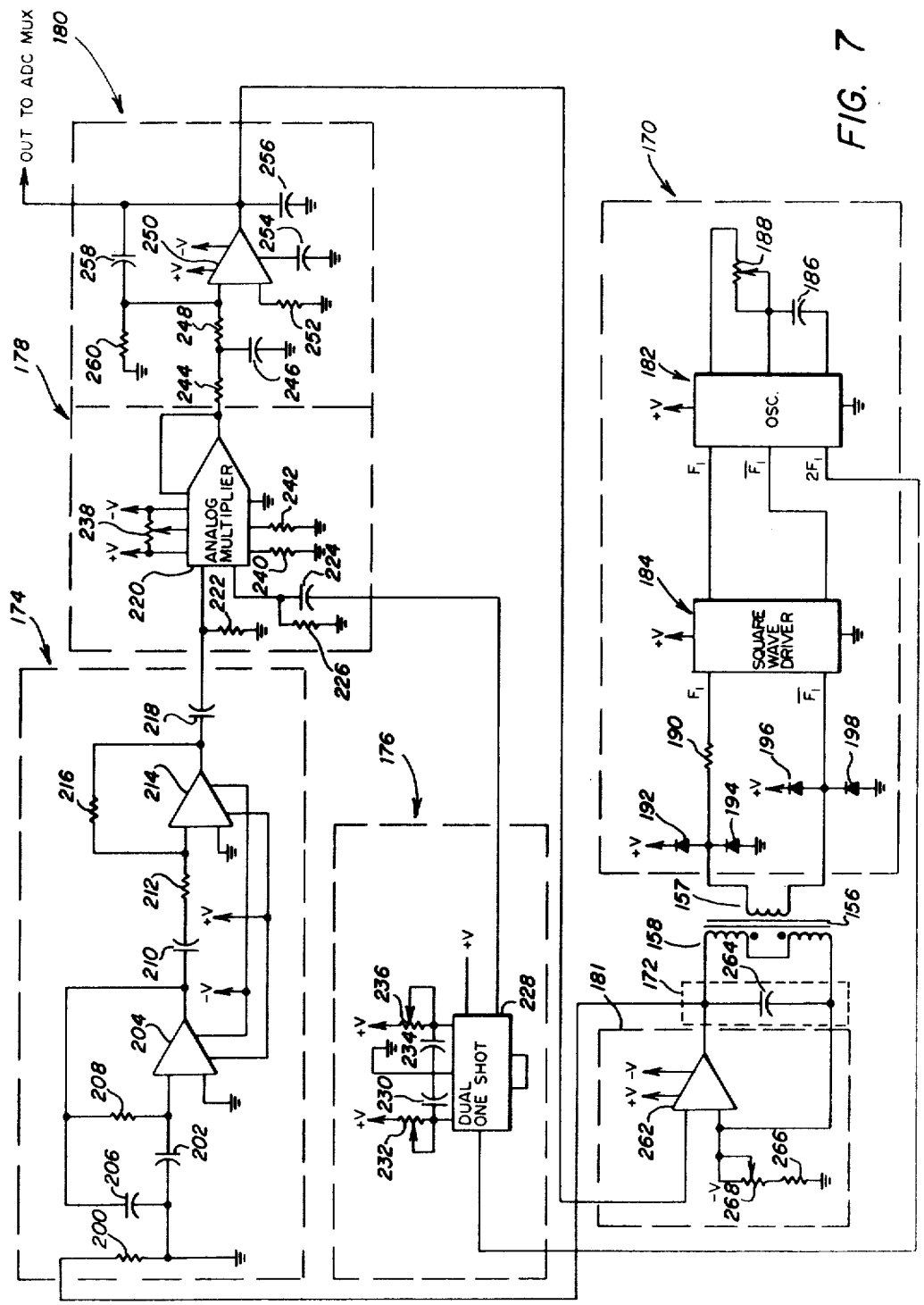
FIG. 7 is a schematic view of the circuitry of the flux gate illustrated in FIG. 6.

FIG. 5 is an exploded view of the five sensors housed within the deviometer 44. Three flux gate magnetometers 150, 152 and 154 measure the three mutual orthogonal components of the earth's magnetic field, $H_X$, $H_Y$ and $H_Z$. The components of the magnetic field are measured with respect to the axis of the logging tool 16. The sensor for each of the three independent flux gates consists of a ring core 156 with a toroidal winding used as the drive winding 157 (shown in FIG. 6) and a differential winding 158 used to sense the difference in saturation due to the earth's flux linkages in the core 156. (A circuit representing the circuitry of one of the flux gates 150, 152, or 154 is illustrated in FIGS. 6 and 7 and described hereinbelow.)

Two accelerometers 160 and 162 measure the two orthogonal components of gravity along the same axis of the logging tool 16. A zero gravity indication occurs when the deviometer 44 is at a vertical position. The three flux gate magnetometers 150, 152 and 154 are mechanically adjustable with respect to the gravitational measurement for an azimuth alignment.

Figure 11:
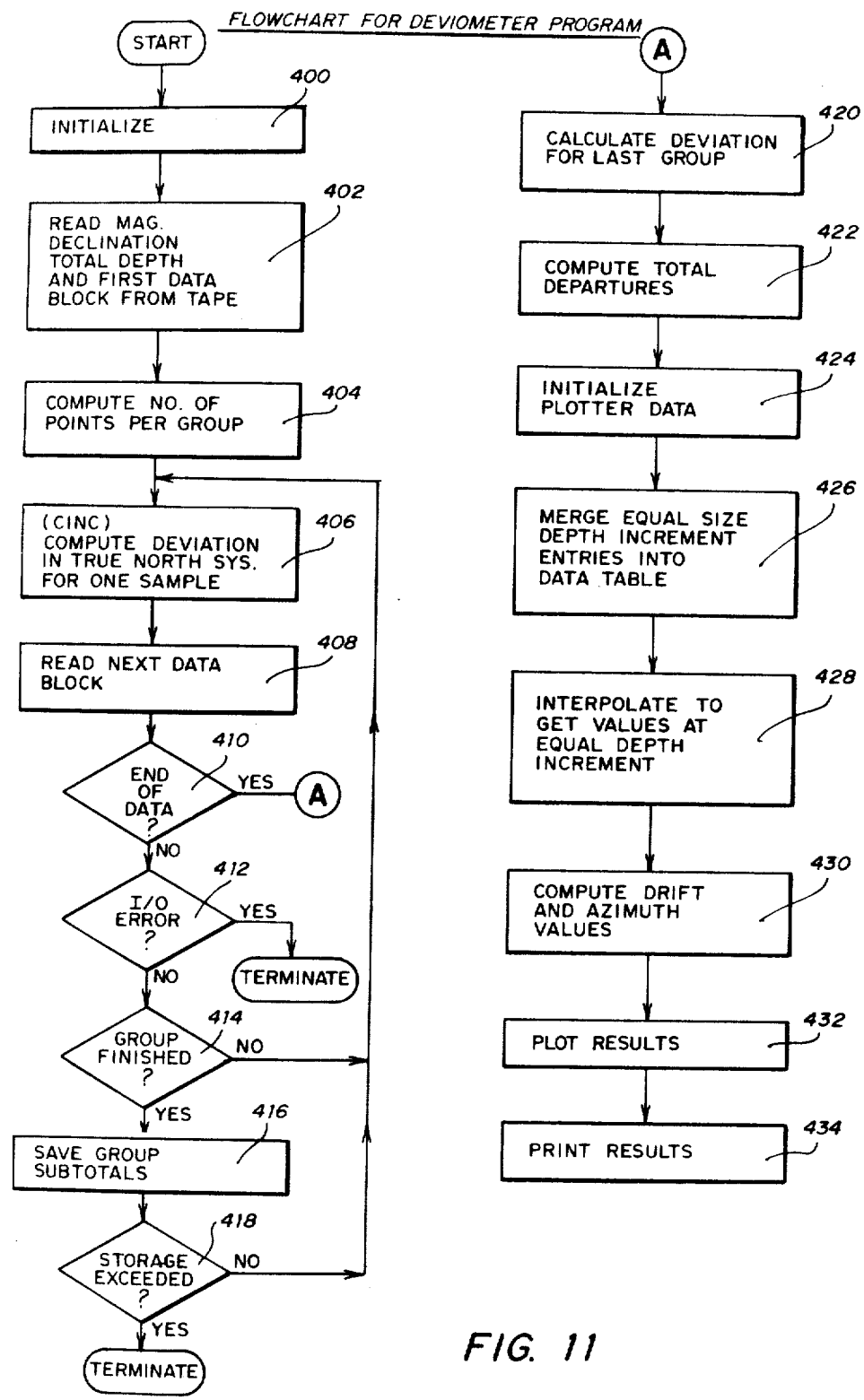
FIG. 11 is a flow chart of the main deviometer data processing program.
Figure 12:
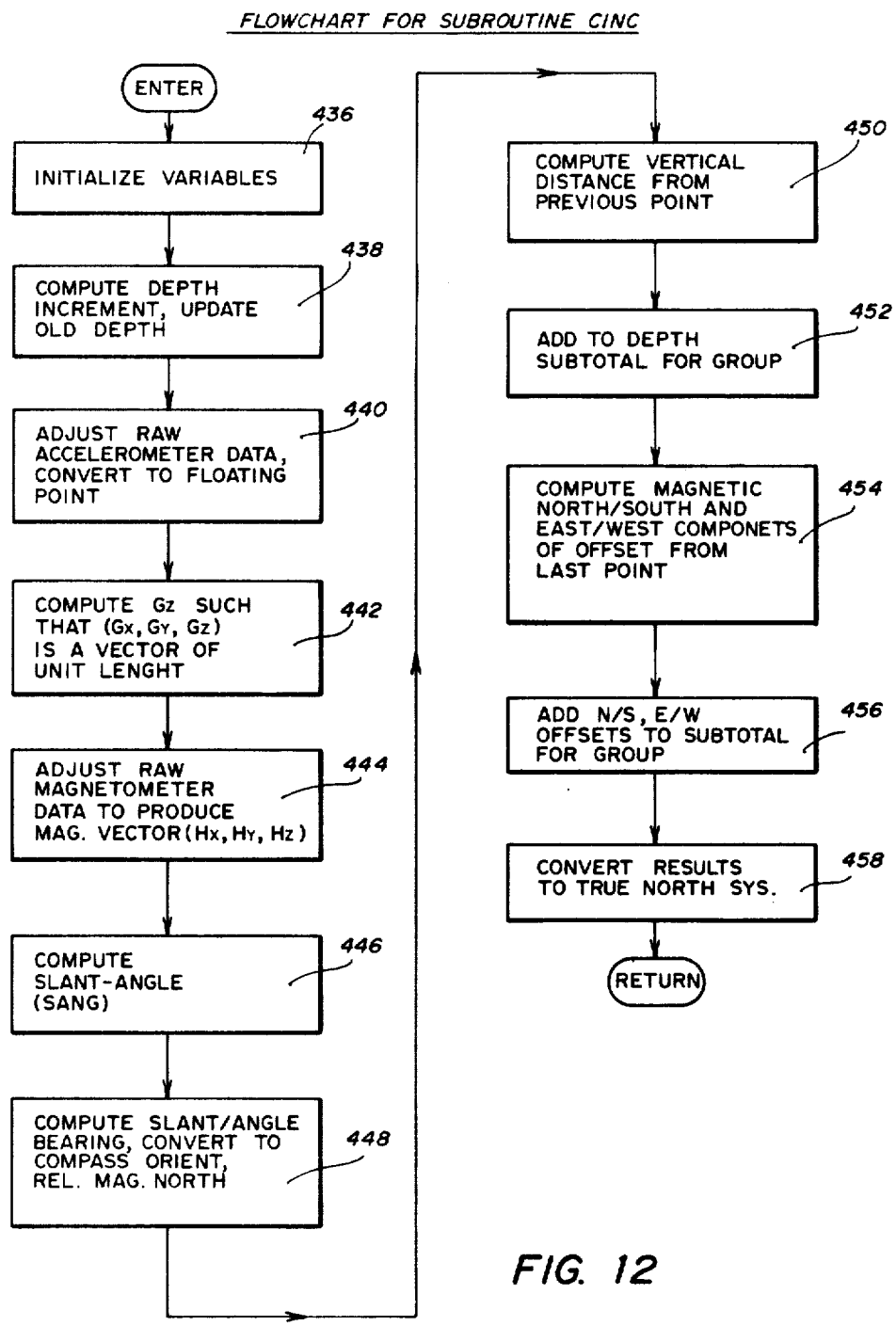
FIG. 12 is a flow chart of the subroutine CINC of the deviometer data processing program of FIG. 11.

The digital signals from the deviometer 44 are read by the computer 78 at a plurality of positions in the borehole. The computer 78 then performs the computations necessary to produce a table of values which describe the true location and orientation of the logging tool 16, and thus the borehole 17, at each of the positions. In the preferred embodiment described herein, the signals from deviometer 44 are read by the computer 78 and then recorded on the data storage medium 84. The necessary computations to reduce the data to borehole location information are done at a later time using the recorded data on the storage medium 84. The deviometer data processing program is illustrated in FIGS. 11 and 12 and described in detail further hereinbelow. A typical mathematical analysis of the computation of the inclination and azimuth from the five parameters of the deviometer is found in U.S. Pat. No. 3,791,043, issued to Michael King Russell on Feb. 12, 1974, and entitled, "Indicating Instruments".

FLUX GATE BLOCK DIAGRAM

FIG. 6 is a block diagram view of one of the flux gates 150, 152 and 154 of the deviometer 44. A square waveform oscillator driver 170 drives the flux gate at a frequency $F_1$ of approximately 7.5 KHz. The oscillator and driver 170 also generates a second harmonic reference signal of twice the frequency $F_1$ of approximately 15 KHz. The sense winding 158 is a differential winding completely around the outside of the ring core 156. The signal from the sense winding 158 is thus proportional in amplitude to the magnitude of the magnetic field that is perpendicular to the coil plane, as illustrated by the vectors $H_X$, $H_Y$ and $H_Z$ in FIG. 5.

The output signal from the sense winding 158 is sent back into the input of a low Q-factor second harmonic tuning element 172 for resonating when the earth's magnetic flux is not nulled in the core 156. An active band pass filter and gain stage 174 removes offsets due to winding shortcomings and circuit offsets. A phase shifter 176 phase shifts the second harmonic reference signal $2F_1$ which is multiplied by the second harmonic error signal in the synchronous demodulator 178 to determine the polarity and magnitude of the error signal with respect to the drive signal saturated in the core 156. An integration stage 180 provides the phase stability and memory for the magnitude of current to eliminate the earth's field. Finally, an error signal is generated whenever a high impedance current source 181 does not null the earth's flux linkages in the core 156.

SCHEMATIC OF THE FLUX GATE CIRCUIT

FIG. 7 is a schematic view of the electronic circuitry of one of the flux gates 150, 152 or 154 of the deviometer 44. The square wave oscillator and driver 170 includes a square wave oscillator 182 having a signal of output frequency $F_1$ and $\overline{F_1}$ driven by a square wave driver 184. The frequency of the oscillator 182 is determined by the capacitor 186 and adjustable resistor 188. The square wave oscillator 182 also has a second harmonic output frequency, $2F_1$, applied to the phase shift network 176. In the preferred embodiment, the square wave oscillator 182 generates the same frequency of approximately 7.5 KHz for each of the flux gates 150, 152 and 154.

The output signal $F_1$ from the square wave driver 184 is applied through a resistor 190 and to the drive winding 157 and returned to the complementary output signal $\overline{F_1}$. Diode pairs 192, 194 and 196, 198 protect the drive circuit 184 from high potential during the switching of the square wave by limiting the voltage excursion of both ends of drive 157 within limits of ground and +V. The sense winding 158 is differentially wound about the ring core 156 to sense the difference in saturation due to the earth's flux linkages within the core 156. The signal picked up by the sense winding 158 is thus proportional in amplitude to the magnitude of the magnetic field that is perpendicular to the plane of the sense winding 158.

A capacitor 264 parallel resonates the sense winding 158 to the frequency $2F_1$. The signal picked up by the sense winding 158 is applied through resistor 200 and capacitor 202 to the input of an operational amplifier configured as a band pass filter 204 of the filter and gain stage 174. The output of the filter 204 is fed back through capacitor 206 and resistor 208 to its input terminal. The tuned filter 204 has a resonant frequency that is a second harmonic to the excitation signal ($F_1$) from oscillator 182 such that only the second harmonic component of the signal picked up by sense winding 158 is extracted. The output from tuned filter 204 is applied through capacitor 210 and resistor 212 to the input terminal of a gain amplifier 214, having its output fed back to its input terminal through a resistor 216.

The amplified second harmonic component from the sense winding 158 is finally applied through a capacitor 218 to the input terminal of a four quadrant analog multiplier 220 of the synchronous demodulator 178. The input terminal of the multiplier 220 is tied to ground through a resistor 222. The second input terminal of the multiplier 220 is the output signal from the phase shifter network 176 applied through the capacitor 224 and ground referenced by resistor 226.

The reference signal applied to the second input terminal of the multiplier 220 is a second harmonic reference square wave generated by a one shot 228. Capacitor 230 and adjustable resistor 232 provide for phase adjustment of the reference signal, while capacitor 234 and adjustable resistor 236 provide means for adjusting the symmetry of the waveform. All three flux gates 150, 152 and 154 use the same demodulating reference signal, because all flux gates are excited by the same reference oscillator 182.

The four quadrant analog multiplier 220 is compensated for offset by an adjustable resistor 238 tied between its two terminals tied to the positive and negative power sources, including a third lead attached to the resistor 238. Resistors 240 and 242 reference the differential terminals of the multiplier 220 to ground. The output from the multiplier 220 is equal to the product of the sinusoidal waveform signal from the tuned filter 174 and the second harmonic reference square wave from the reference signal network 176. The output from the multiplier 220 will be in effect a rectified sine wave, the polarity of which depends on the phase of the input signal from the tuned filter 174.

The output signal from the synchronous demodulator 178 is next integrated in the integration stage 180, comprising the resistor 244 and capacitor 246. The integrated output from the capacitor 246 is applied through a resistor 248 to one input terminal of an operational amplifier 250, which forms the memory on the output of the integrating capacitor 258 for the magnitude of current to eliminate the earth's field. The second input terminal of the operational amplifier 250 is grounded through resistor 252. Capacitors 254 and 256 are required for compensation of the circuit. The output of the amplifier 250 is fed back through the integrating capacitor 258 to the inverting input terminal to complete the loop. Resistor 260 provides a high impedance discharge path for the stored charge in the integrating capacitor 258 when the power is removed. The output from the demodulator stage 178 is a rectified signal whose d-c component is proportional to the earth's field. However, the output of such a magnetometer would be unstable due to the characteristics of the core 156 with temperature variations; and the tuning of the amplifier 174 would effect the transfer function of the magnetic field to voltage at that point. The operational stability of the flux gate 150 is enhanced by picking an operating point of null for the core 156 so that it will operate to see no field by generating the canceling field with the sense winding 158. This is accomplished by providing a means for flowing d-c through the sense winding 158, since the sense winding 158 is capable of generating a field in a direction perpendicular to winding plane opposite the component of the measured field. Thus, by balancing the component of the field, the second harmonic output of the sense winding 158 is again zero.

The stability of the flux gate in the preferred embodiment is achieved by the use of an operational amplifier 262 as a means of flowing the d-c as a current source in the sense winding 158 without loading the winding 158. The operational amplifier 262 operates as a current source whose impedance is a function of the resistor values and the open loop gain of the amplifier 262, which results in an impedance value that is quite high. Resistor 266 and the variable resistor 268 are connected from the second input terminal of the operational amplifier 262 to a ground to act as a shunt, so that a measurement of voltage can be taken to determine how much direct current is flowing in the sense winding 158. When the loop is closed thusly, the transfer function of the magnetometer from magnetic field to the output of the integration stage is stable, since it relates to the earth's field in terms of the number of turns and the current flowing to produce a canceling field.

SCHEMATIC OF ANALOG TO DIGITAL MODULE

Figure 8:
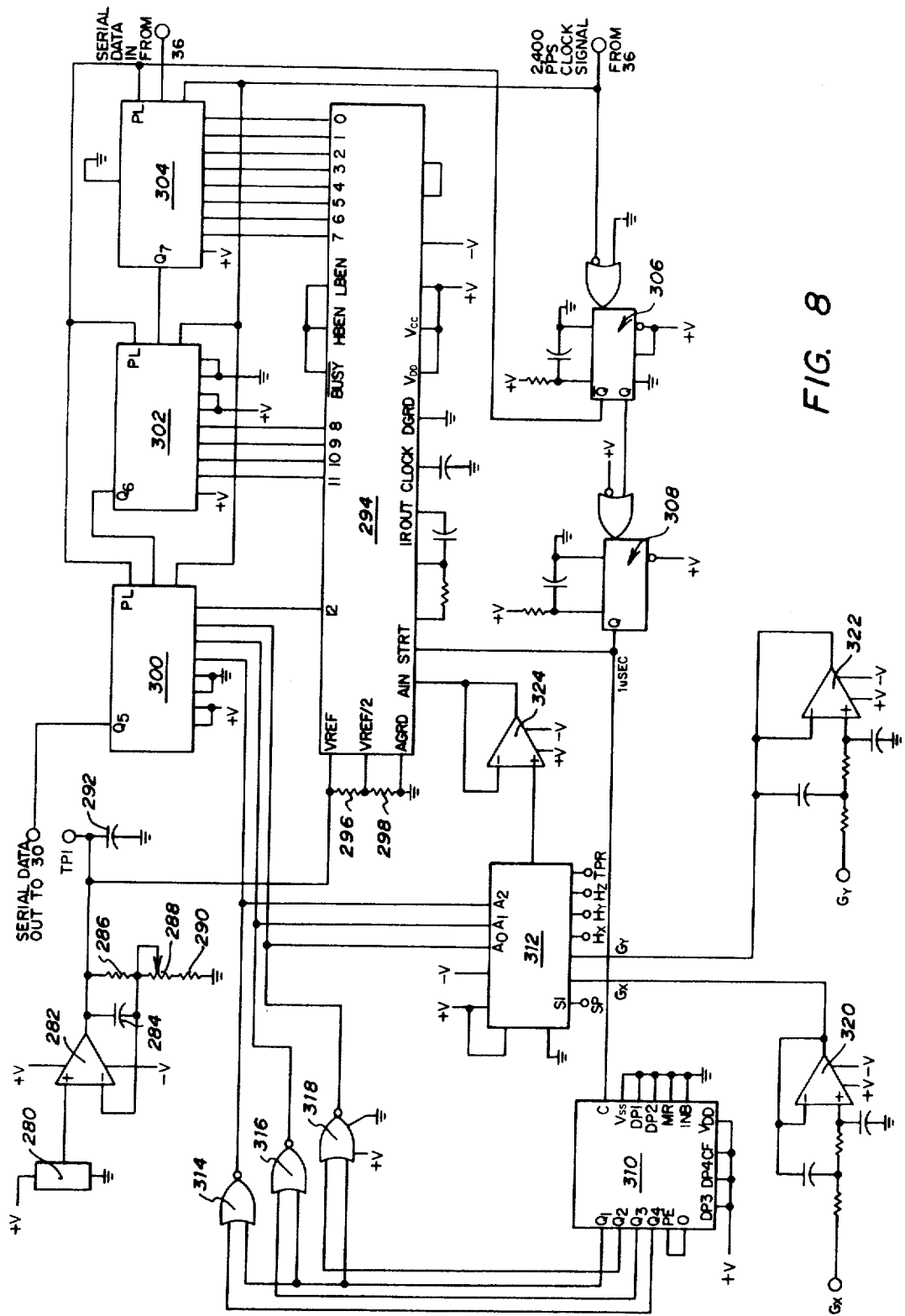
FIG. 8 is a schematic drawing of the circuitry of the analog to digital module.

FIG. 8 is a schematic drawing of the analog to digital module 42. A voltage regulator 280 provides a stable reference voltage to the positive input terminal of an amplifier 282. The output of amplifier 282 is coupled back to the negative input terminal through a parallel coupled capacitor 284 and resistor 286. The negative input terminal of the amplifier 282 is also tied to ground through an adjustable resistor 288 and a resistor 290. The adjustable resistor 288 provides a method of adjusting the output voltage from amplifier 282 to a precise stabilized value. The stabilized voltage is available as reference voltage $TP_1$ to other circuits in the tool 16, and it is high frequency coupled to ground through capacitor 292.

The stabilized reference voltage $TP_1$ from the amplifier 282 is applied as the reference voltage to an analog to digital converter 294. The reference voltage TP1 is divided through resistors 296 and 298 of equal resistance, allowing one-half the reference voltage TP1 to be applied to an input terminal of the analog to digital converter 294. The twelve bits of data present on the output lines of the analog to digital converter 294 are applied to the gated parallel load inputs of the analog to digital shift registers 300, 302 and 304. The shift registers 300, 302 and 304 have their outputs serially connected for the batch transmission of data upon command from the serialization and transmission control circuit 52. The serial data input terminal of the shift register 304 is serially connected to the serial data output of the registers of the neutron-neutron module 36. The serial data output of the first of the analog to digital shift registers 300 is connected to the serial data input terminal of the last shift register of the natural gamma module 30.

As described further hereinbelow in the description of the serialization and transmission circuit 52 of FIG. 10, a 2400 pulse per second clock signal is applied at a sampling rate of 100 milliseconds. On the first leading edge of the first clock pulse, a one shot 306 is fired and stays fired throughout the transmission of the serialized data from the registers 300, 302 and 304. The Q output from the one shot 306 is applied to the parallel load terminals of the shift registers 300, 302 and 304 in order to isolate the shift registers from the analog to digital converter 294. In this arrangement, the shift registers 300, 302 and 304 are normally in the transfer mode, and the 2400 pulse per second clock burst appearing at the one shot 306 isolates the shift registers 300, 302 and 304.

The Q output from the one shot 306 fires a second one shot 308 which produces a single one microsecond strobe pulse at its Q output terminal. The one microsecond pulse is applied to the start terminal of the analog to digital converter 294 and to the clock terminal of the counter 310. The start pulse applied to the analog to digital converter 294 disconnects the converter 294 from its input and allows the conversion to take place through an integration countdown routine to charge a capacitor. When the analog to digital converter 294 is finished, there are twelve bits of data present on the output lines to the shift registers 300, 302 and 304.

The counter 310 controls an analog multiplexer 312 and three NOR gates 314, 316 and 318 for sequencing the proper one of the seven analog input signals at the multiplexer 312 to the analog to digital converter 294. The seven analog input signals are the spontaneous potential (SP), the two orthogonal components of the gravitational field ($G_X$ and $G_Y$), the three mutually orthogonal components of the magnetic field ($H_X$, $H_Y$ and $H_Z$), and the temperature. The two mutually orthogonal components of the gravitational field ($G_X$ and $G_Y$) are connected through low pass active filters 320 and 322 to the input terminals of the analog multiplexer 312. The three input signals of the magnetic field ($H_X$, $H_Y$ and $H_Z$) do not require filtering because the flux gate electronics illustrated in FIG. 6 and described above provides an integration state 180 for limiting the band width. The analog input signal selected from a channel of the analog multiplexer 312 is applied to the positive input terminal of an amplifier 324, having its output connected to the input terminal of the analog to digital converter 294.

The $Q_1$, $Q_2$, $Q_3$ and $Q_4$ outputs of the counter 310 are selectively applied through gates 314, 316 and 318 to the input terminals $A_0$, $A_1$ and $A_2$ of multiplexer 312 for proper sequencing of the seven analog input signals to the analog to digital converter 294. The counter 310 and the NOR gates 314, 316 and 318 operate to select the spontaneous potential on every other transmission signal received. The remaining six analog input signals are alternately selected between the sampling of the spontaneous potential signal. The spontaneous potential is selected at a higher sample frequency, since it is a plotted log, while the remaining six analog input signals are sampled at lower rates. At the ten hertz (10 Hz) sampling rate, the spontaneous potential is sampled at a five sample per second rate. This is accomplished by applying the $Q_1$ output to all three NOR gates 314, 316 and 318. Thus, when the $Q_1$ output is high, the output of all three NOR gates 314, 316 and 318 is low, which results in selecting the spontaneous potential input channel on the analog multiplexer 312. When $Q_1$ goes low, the outputs from terminals $Q_2$, $Q_3$ and $Q_4$ will be applied through NOR gates 314, 316 and 318 to select one of the other six analog input channels. The output from the NOR gates 314, 316 and 318 is also applied as a signal address to the first analog to digital shift register 300.

SCHEMATIC OF THE NATURAL GAMMA MODULE

Figure 9:
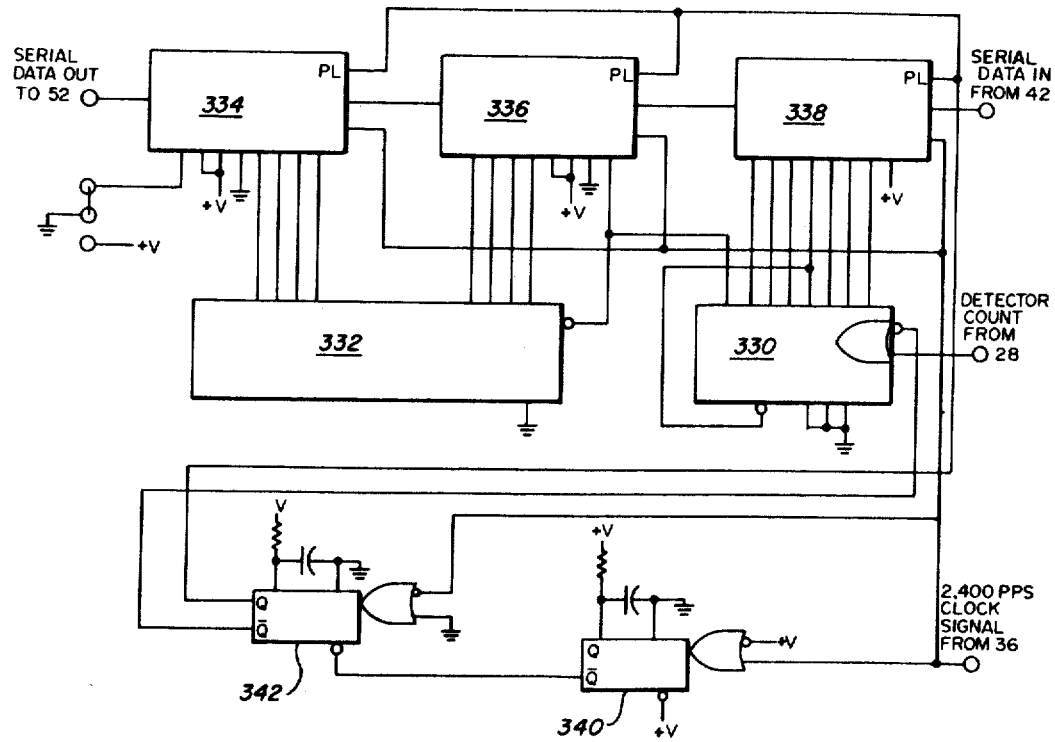
FIG. 9 is a schematic view of the circuitry of the natural gamma module.

FIG. 9 is a schematic illustration of the circuitry of the natural gamma module 30. The neutron-neutron module 36 is not illustrated since it is identical to the circuit of the natural gamma module 30. The natural gamma count from the baseline restorer 28 is applied to an input terminal of a gate-on counter 330 having its highest order output terminal connected to the input terminal of a second binary counter 332. The cascaded binary counters 330 and 332 form a sixteen bit binary counter.

The 2400 pulse per second clock burst signal is applied at the ten hertz (10 Hz) sampling rate from the serialization and transmission circuit 52 to the input of a first retriggerable one shot 340. The 2400 pulse per second clock burst signal is also applied to the input terminal of a second one shot 342 for producing a transfer of data from the counter 330, 332 to the registers 334, 336 and 338. When the output of the second one shot 342 goes high, it strobes the data out of the binary counters 330 and 332 into the shift registers 334, 336 and 338. The trailing edge of the first clock signal in the 2400 pps burst to the first one shot 340 causes Q output to reset the second one shot 342. The second one shot 342 is reset so that it will not fire on each successive clock pulse in the burst, but only on the first clock pulse to produce a transfer of data. The Q output from the second one shot 342 then disables the count input on counter 330 to prevent the transfer of data during count propagation causing an erroneous number at the moment of transfer. The contents of the registers 334, 336 and 338 are then transmitted out at the 2400 pulse per second batch transmission rate.

The least significant bit of the shift register 334 is tied to ground as a "0" bit of the eight bit tool identification code wired into the shift register 310 of the serialization and transmission control circuit illustrated and described below in FIG. 10. Of course, the least significant bit of the shift register 334 may be tied to either a ground terminal or a positive voltage terminal to create the desired "0" or "1" binary number for the eight bit binary identification code of the logging tool 16.

SCHEMATIC OF SERIALIZATION AND TRANSMISSION CONTROL

Figure 10:
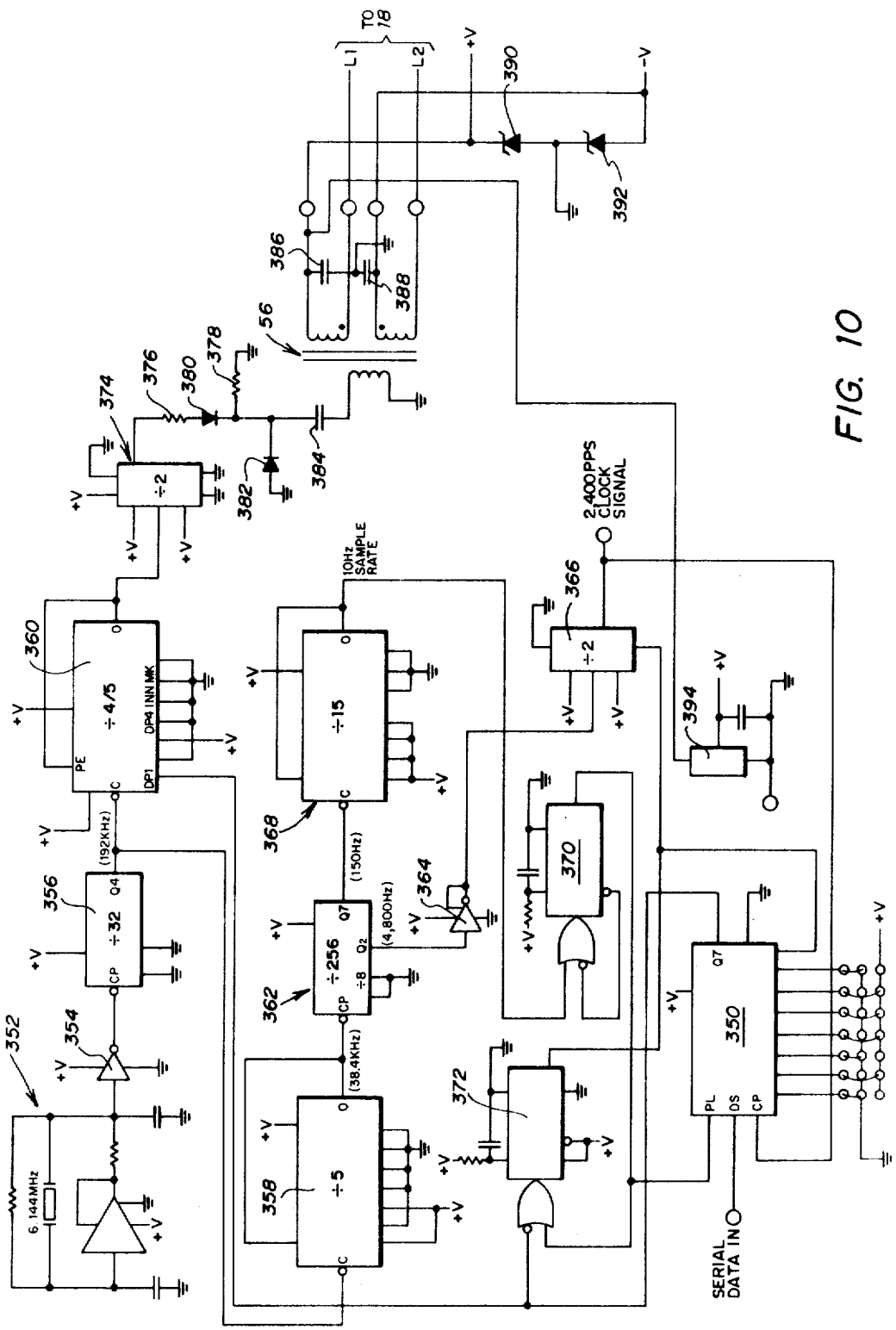
FIG. 10 is a schematic view of the circuitry of the serialization and transmission control module.

FIG. 10 is a schematic illustration of the serialization and transmission control circuit 52. A 6.144 MHz crystal oscillator circuit 352 goes through a buffer 354 to the input terminal of a divide by 32 frequency divider 356. The buffer 354 acts to isolate the crystal oscillator 352 from circuit loading. The frequency divider 356 has 192 KHz output signal which is applied to a divide by 5 frequency divider 358 and a programmable divider 360. The programmable divider 360 can divide by 4 or 5 to act as a two-tone generator for the frequency shift key transmission system.

The output of the frequency divider 358 is a 38.4 KHz signal applied to a frequency divider 362 which has two outputs. The output signal from the $Q_2$ terminal divides the input signal by 8 to produce a 4,800 Hz signal applied to an inverter 364. The signal from the inverter 364 is applied to a divide by 2 frequency divider 366 to produce at one output terminal the 2400 pulse per second clock signal, which is the clock signal for controlling the baud rate data is serially transmitted. The second output of divider 362 is from $Q_7$, and it divides the input signal by 256 to apply a 150 Hz signal to a divide by 15 frequency divider 368. The output from the frequency divider 368 is a 10 Hz signal, which is the sample rate at which the serialized data in the shift registers is batch transmitted to the surface by the 2400 pulse per second clock burst signal.

The 10 Hz sample rate signal from the frequency divider 368 fires a one shot 370 that provides the parallel load function for the tool identification shift register 350.

The output of the one shot 370 is also used to fire a second one shot 372 which relieves the reset on the divider 366 to turn on the 2400 pulse per second clock burst signal. The reset of the divider 366 is normally held on so that the 2400 pulse per second is normally off. The ouput from the Q$_7$ terminal of the tool identification shift register 350 is used to turn off the one shot 372 to prevent possible transmission overrun.

The output of the tool identification shift register 350 is tied to the DP1 pin of the programmable divider 360, the two-tone generator for the frequency shift key transmission system. As an example, a zero bit transmitted from the Q$_7$ terminal may be programmed to cause the divider 360 to divide by four to produce a 48 KHz signal. Similarly, a one bit at the DP1 pin of the divider 360 may be programmed to divide the input frequency by five to produce an output frequency of 38.4 KHz. The output from the programmable divider 360 is applied to the input of a divide by 2 frequency divider and driver 374. The output from the driver 374 is a squarewave going between zero and 12 volts at a frequency determined by the programmable divider 360. The squarewave output from the divider 374 is then amplitude divided by resistors 376 and 378. A normally forward biased diode 380 and a normally back biased diode 382 are provided to protect the frequency divider and driver 374, where the diode 380 protects the integrated circuit from a large positive spike, and diode 382 protects the integrated circuit from a large negative spike. A capacitor 384 couples the signal into the transformer 56. The two-tone frequency coupled through the transformer 56 is applied through L1 and L2 to be transmitted up the cable 18 for demodulation and signal processing. Two leads from the transformer 56 are a-c coupled to ground through capacitors 386 and 388 and d-c regulated by zenner diodes 390 and 392 to provide a d-c power for the remainder of the tool 16. Finally, the voltage at the capacitor 386 is applied to a voltage regulator 394 to provide power for the digital logic.

Deviometer Data Processing Flow Charts

FIGS. 11 and 12 illustrate flow charts describing the processing of the deviometer data by the computer 78 during the computing phase of the mineral logging operation. In the preferred embodiment of the invention, the digital signals from the deviometer 44 are read by the computer 78 and recorded in the data storage medium 84 during a recording phase. During the computing phase, the computer 78 performs the computations necessary to produce a table of values which describe the true location and orientation of the logging tool 16, and thus the borehole 17, at each of the positions data is recorded. Upon completion of the computations, the data may be presented on the digital plotter 86 as a graphic plan view of the hole 17, or the printer 88 produces a listing of the tabulated location information concerning the borehole 17, or both. The only difference is the manner in which the data prepared by the computer 78 is presented.

At normal logging rates with the logging tool 16 moving less than sixth (60) feet per minute, the data from the deviometer 44 would be recorded every five feet as a set of five parameters representing the output from the two accelerometers ($G_X$ and $G_Y$) and the three flux gate magnetometers ($H_X$, $H_Y$ and $H_Z$). For a borehole 17 of any depth of normal interest, there may be hundreds of sets of data from the deviometer 44 recorded at points five feet apart in the borehole 17. Ordinarily this amount of detail is not needed in the tabulated or plotted results. Thus, while the computer 78 makes all the necessary calculations for every set of data recorded from the deviometer 44, the deviometer program displays in tabulated or plotted form only a limited number of sets of location data which are of the nature of subtotals for groups of points down the hole. In practice, it has been found that fifteen to thirty tabulated or plotted sets of location data represent a desirable number. The deviometer program, therefore, selects a group sized to represent increments of five, ten, twenty-five, fifty, one hundred or two hundred feet according to which scale will yield fifteen to thirty sets of location data. The processing program (FIG. 12) for the computer 78 takes each set of data from the deviometer 44, calculates the slant-angle and slant-angle-bearing at that point in the hole 17, then computes the location of that point relative to the previous point in rectangular coordinates. The program then accumulates the results of these calculations for a group of points and displays the results on the digital plotter 86, printer 88, or both.

FIG. 11 illustrates a flow chart for the main deviometer data processing program. However, most of the actual computation is done by subroutine CINC which is described in greater detail in FIG. 12. Subroutine CINC is the routine which does the actual deviation computation for the location of each point in the hole relative to the previous point, accumulates the depth, north/south offset, and east/west offset for one group of fifteen to thirty deviometer portions. The main program, FIG. 11, builds a table of these group subtotals to be plotted or printed after the tabulated results are linked up and accumulated from one end of the hole to the other.

In the main deviometer data processing program of FIG. 11, the program is initialized by instruction 400, while instruction 402 causes the computer 78 to read the magnetic declination, total depth the logging tool was lowered in the bore hole, and the first data block from the tape. From the total depth of the bore hole, instruction 404 causes the computer 78 to compute the number of points per group which would yield fifteen to thirty sets of location data.

The instruction 406 for subroutine CINC (illustrated in flow chart FIG. 12) computes the deviation in the true north system for the first data sample. The calculations of subroutine CINC are performed for each set of deviometer data. Having completed the calculations for one sample of deviometer data, instruction 408 causes the computer 78 to read the next data block from the tape.

Branching instruction 410 looks for the end of data from the tape. If all data has been read from the tape, the program branches to continue at "A", described further hereinbelow. If the end of the data has not been reached, the program branches to an input/output error check 412, which terminates the program if an error is detected. If no error has been detected, the program branches to a group finished check 414, which branches the program back to the subroutine CINC 406 if additional points in the group remain to be calculated. If all points in the group have been calculated, instruction 416 causes the group subtotals to be saved, and a subtotal storage exceeded check 418 is made. If the storage is exceeded, the program is terminated, but if it is not the program returns to the subroutine CINC 406 to continue calculation of the deviometer data.

When the end of data check 410 indicates all deviometer data has been processed, the program branches to "A", beginning with instruction 420 for calculating the deviation of the last group subtotal. The next instruction 422 causes the computer 78 to compute the total departures for all the groups. Plotter data is initialized by instruction 424, and instruction 426 merges equal size depth increment entries and their associated symbol code into the data table. Instruction 428 interpolates entries in the data table to get value at the equal depth increments. Instruction 430 is the final computation instruction to compute the drift and azimuth values for the equal depth increments from the data. Program instruction 432 causes the plotting of the deviometer data on plotter 86, and the program instruction 434 causes the printing of the deviometer data on the printer 88.

FIG. 12 illustrates the subroutine CINC instruction 406 of FIG. 11, where most of the computation is done by the deviometer data processing program. First, instruction 436 initializes the variables, and instructions 438 subtracts the cable depth of the previous points from the cable depth of the current point to get the depth increments and updates the old depth.

Instruction 440 adjusts the raw accelerometer data by multiplying the X and Y accelerometer data values by sign and scaling factors to scale values to the sign of their respective axis to adjust for device differences and polarity of signals. The resulting values are converted to floating point variables $G_X$ and $G_Y$. Instruction 442 computes a value $G_Z$ such that $G_X$, $G_Y$ and $G_Z$ form the components of a vector of unit length. The subroutine CINC's next program instruction 444 adjusts the raw magnetometer data to produce the magnetic vector $H_X$, $X_Y$ and $H_Z$.

Instruction 446 causes the slant angle (SANG) to be computed using the following formula:

$$SANG = \tan^{-1} \frac{(G_X^2 + G_Y^2)^{\frac{1}{2}}}{G_Z}$$

Next, program instruction 448 computes the slant-angle-bearing (SANGB), the angle between the north (magnetic at this stage) and the direction of the logging tool 16 in the standard compass orientation using the following formula:

$$SANGB = \tan^{-1} \frac{/H_X{}^* G_Y - H_Y{}^* G_X/}{G_Y{}^* [(H_Z{}^* G_Y) - (H_Y{}^* G_Z)] + G_X{}^* [(H_Z{}^* G_X) - (H_X{}^* G_Z)]}$$

(*indicates multiplication.)

Program instructions 450 and 452 cause the vertical distance from the previous point to be computed and to add this to the previously accumulated subtotal for this group. Instruction 454 computes magnetic north-south and east-west components of offset from the previous point and instruction 456 adds these to the accumulated subtotals for this group. Finally, instruction 458 converts the results to the true north system using the magnetic declination and returns to the main deviometer data processing program (FIG. 11).

Fortran Statements for Subroutine Cinc

Listed below are the FORTRAN statements for subroutine CINC of FIG. 12, where the numbers at the upper right of the boxes comprising the flow chart of subroutine CINC refer to the listing of FORTRAN statements which are separated by brackets.

```
                                                                PAGE 00001

UNL                                                      0 000010
C*******************                                            0 000020
C                                                               0 000030
         SUBROUTINE CINC(IDATA,IDEPN,IDEPO,DEEP,ANSD,AEND,       0 000040
         *INSD,TEND,THETA,SCALE)                                 0 000050
C                                                               0 000060
                                                                0 000070
C*********************                                          0 000080
C                                                               0 000090
C      CENTURY INCLINOMETER DATA PROCESSOR                      0 000100
C                                                               0 000110
C      CALCULATES THE TRUE POSITION OF ONE SAMPLE POINT          0 000120
C      IN 3-D XYZ CO-ORD SYSTEM                                 0 000130
C         X=EAST-WEST                                           0 000140
C         Y=NORTH-SOUTH                                         0 000150
C         Z=VERTICAL AXIS                                       0 000160
C                                                               0 000170
C      REFERENCE DATUM FOR ALL AXES IS SURFACE COLLAR           0 000180
C                                                               0 000190
C      CALCULATED RESULTS ARE ROTATED ABOUT THE Z AXIS BY ANGLE THETA.  0 000200
C                                                               0 000210
C*****************                                              0 000220
C                                                               0 000230
         DIMENSION IDATA(5)                                     0 000240
         DIMENSION SCALE(5)                                     0 000250
   C                                                            0 000260
         DATA PI/3.14159265/                                    0 000270
   C     RADIAN TO DEGREE CONVERSION                            0 000280
436      RTDEG=180./PI                                          0 000290
         HAFPI=PI/2.0                                           0 000300
         STHTA=FSIN(THETA/RTDEG)                                0 000310
         CTHTA=FCOS(THETA/RTDEG)                                0 000320
   C
```

```
PAGE+00002
C****  CALCULATE TRUE POSITION IN MAGNETIC REFERENCED CO-ORD SYSTEM     0 000330
C                                                                       0 000340
C      GET DEPTH INCREMENT                                              0 000350
C                                                                       0 000360
       DINC=IDEPO-IDEPN                                                 0 000370
       IDEPO=IDEPN                                                      0 000380
C                                                                       0 000390
C      GET X AND Y ACCELEROMETER VALUES AND ADJUST BY SCALE FACTORS     0 000400
C                                                                       0 000410
       GX=FLOAT(IDATA(1))*SCALE(1)                                      0 000420
       GY=FLOAT(IDATA(2))*SCALE(2)                                      0 000430
C                                                                       0 000440
C      SYNTHETHIZE Z ACCELROMETER VALUE SO THAT !G!=1                   0 000450
C                                                                       0 000460
       GZ=SQRT(1.0-(GX*GX)-(GY*GY))                                     0 000470
C                                                                       0 000480
C      GET X,Y AND Z MAGNETOMETER VALUES AND ADJUST BY SCALE FACTORS    0 000490
C                                                                       0 000500
       HX=FLOAT(IDATA(3))*SCALE(3)                                      0 000510
       HY=FLOAT(IDATA(4))*SCALE(4)                                      0 000520
       HZ=FLOAT(IDATA(5))*SCALE(5)                                      0 000530
C                                                                       0 000540
C      COMPUTE SLANT ANGLE (SANG)                                       0 000550
C                                                                       0 000560
       TSANG=SQRT((GX*GX)+(GY*GY))/GZ                                   0 000570
       SANG=ATAN(TSANG)                                                 0 000580
C                                                                       0 000590
C****  COMPUTE SLANT ANGLE BEARING (SANGB)                              0 000600
C                                                                       0 000610
       IF(SANG)100,200,100                                              0 000620
100    CONTINUE                                                         0 000630
C                                                                       0 000640
C      SIN(SANGB)=A/C; COS(SANGB)=B/C; TAN(SANGB)=A/B                   0 000650
C                                                                       0 000660
C      COMPUTE C                                                        0 000670
C                                                                       0 000680
       FACT1=SQRT((GX*GX)+(GY*GY))                                      0 000690
C                                                                       0 000700
       SQAR1=((HY*GZ)-(HZ*GY))**2                                       0 000710
       SQAR2=((HZ*GX)-(HX*GZ))**2                                       0 000720
       SQAR3=((HX*GY)-(HY*GX))**2                                       0 000730
C                                                                       0 000740
       FACT2=SQRT(SQAR1+SQAR2+SQAR3)                                    0 000750
C                                                                       0 000760
       C=FACT1*FACT2                                                    0 000770
C                                                                       0 000780
C      COMPUTE A                                                        0 000790
C                                                                       0 000800
       A=(HX*GY)-(HY*GX)                                                0 000810
       ABA=ABS(A)                                                       0 000820
C                                                                       0 000830
C      COMPUTE B                                                        0 000840
C                                                                       0 000850
       FACT1=GY*((HZ*GY)-(HY*GZ))                                       0 000860
       FACT2=GX*((HZ*GX)-(HX*GZ))                                       0 000870
C                                                                       0 000880
       B=FACT1+FACT2                                                    0 000890
C                                                                       0 000900
C      COMPUTE SIN, COS AND TAN  AND SANGB                              0 000910
C                                                                       0 000920
       SINSB=A/C                                                        0 000930
       COSSB=B/C                                                        0 000940
       TANSB=ABA/B                                                      0 000950
       SANGB=ATAN(TANSB)                                                0 000960
C                                                                       0 000970
C****  DETERMINE PROPER QUADRANT ANDS ADJUST ANGLE ACCORDINGLY          0 000980
C                                                                       0 000990
       IF(COSSB)130,110,130                                             0 001000
110    IF(SINSB)115,950,120                                             0 001010
115    SANGB=3.0*HAFPI                                                  0 001020
       GO TO 200                                                        0 001030
120    SANGB=HAFPI                                                      0 001040
       GO TO 200                                                        0 001050
130    IF(SINSB)150,135,165                                             0 001060
135    IF(COSSB)140,950,145                                             0 001070
140    SANGB=PI                                                         0 001080
       GO TO 200                                                        0 001090
145    SANGB=0.0                                                        0 001100
       GO TO 200                                                        0 001110
150    IF(SANGB)155,950,160                                             0 001120
```

```
                                                                              PAGE 00003
448
CONT'D
      155    SANGB=PI-SANGB                                          0  001130
             GO TO 200                                               0  001140
      160    SANGB=2.0*PI-SANGB                                      0  001150
             GO TO 200                                               0  001160
      165    IF(SANGB)170,950,200                                    0  001170
      170    SANGB=SANGB+PI                                          0  001180
      C                                                              0  001190
      C      CONVERT TO EW AND NS CO-ORDINATES                       0  001200
      C                                                              0  001210
      200    CONTINUE                                                0  001220
             IF(SANGB-PI)240,240,250                                 0  001230
      240    SANGB=HAFPI-SANGB                                       0  001240
             SSAN=1                                                  0  001250
             GO TO 252                                               0  001260
      250    SANGB=(3.0*HAFPI)-SANGB                                 0  001270
             SSAN=-1                                                 0  001280
      C                                                              0  001290
      C      COMPUTE VERTICAL DEPTH OF INCREMENT,SUM, AND STORE.     0  001300
      C                                                              0  001310
450   252    CONTINUE                                                0  001320
             DVERT=DINC*ECOS(SANG)                                   0  001330
452          DEEP=DEEP+DVERT                                         0  001340
      C                                                              0  001350
454   C      SOLVE FOR EW AND NS COMPONENTS OF DEPARTURE (MAG. NORTH SYSTEM)  0  001360
      C                                                              0  001370
      270    CONTINUE                                                0  001380
             GDEV=DINC*ESIN(SANG)                                    0  001390
456          ANSD=(GDEV*ESIN(SANGB)*100.*SSAN)+ANSD                  0  001400
             AEWD=(GDEV*ECOS(SANGB)*100.*SSAN)+AEWD                  0  001410
                                                                     0  001420
      C      CONVERT TO TRUE NORTH SYSTEM                            0  001430
      C                                                              0  001440
458          TEWD=(AEWD*CTHTA)-(ANSD*STHTA)                          0  001450
             TNSD=(ANSD*CTHTA)+(AEWD*STHTA)                          0  001460
      C                                                              0  001470
      950    CONTINUE                                                0  001480
      C                                                              0  001490
             END                                                     0  001500
      /*
```

Operation of the Digital Mineral Logging System

The logging run is begun by lowering the mineral logging tool 16 suspended by the cable 18 to the bottom of the borehole 17. The digital mineral logging system 10 is operational before the logging tool 16 is placed in the borehole 17, so that the tool 16 continues to transmit the tool ID code uphole to the computer 78 during the downhole run. If an error occurs in transmitting the tool ID code, the computer causes a warning to be displayed on the CRT display unit 92 to alert the operator of a malfunction in the FSK transmission system. The strain monitor indicates to the operator when the logging tool 16 has reached bottom.

When the tool 16 reaches the bottom of the borehole 17, the operator may begin the recording phase of the mineral logging system 10 during the uphole logging run. All necessary logging data is obtainable on the single uphole logging run, including data from the deviometer 44. At normal logging rates, the tool 16 is raised at a rate of approximately sixty feet per minute. The logging tool 16 has a unique tool identification number strapped to the tool shift register 350. The serialization and transmission control circuit 52 will sample the serialized data from the multiple sensors of the tool 16 every 100 milliseconds. The first eight bits of data read by the computer 78 in each batch of data represent the tool ID code. By using eight bits, there are 256 different numbers available for identifying the logging tools. By reserving blocks of the 256 different numbers for each type of logging tool, it is possible to identify both the type of tool and which individual tool of that type it is.

As the mineral logging tool 16 is moving uphole, the computer 78 which reads the data from the logging tool is programmed to compare the readings to a set of tables which lists the range of numbers assigned to each type of logging tool. The program scans the tables and either identifies the tool 16 or notifies the operator via the CRT display and keyboard unit 92 that it is unable to identify the logging tool. This means that the operator has the wrong type of logging tool, or either the logging tool or the transmission system is malfunctioning. On subsequent transmissions, the computer 78 is programmed to compare the tool ID number with the previously transmitted tool ID number. If the computer 78 notes any discrepancies in the two numbers, it notifies the operator that the tool identification has changed, which indicates a malfunction if the operator has not changed logging tools. If after several transmissions, the new tool identification number remains unchanged, the program assumes the operator has changed logging tools and repeats the procedure of scanning its tables to identify the new logging tool.

The multiple sensors housed in the logging tool 16 enable the operator to obtain in a single logging run information on natural gamma radiation, resistivity, spontaneous potential, temperature, neutron-neutron porosity, and the deviation of the borehole 17. The information is recorded on the data storage medium 84 for subsequent computation. Of course, the computer 16 may be programmed to provide real time plotting capabilities to plot a selected log of data as the tool 16 is brought uphole.

Upon completion of the logging run, the operator may have the digital mineral logging system 10 perform the necessary computations at any convenient time. The calculation of the deviometer data has been previously described above in the description of the flow charts illustrated in FIGS. 11, 12 and the FORTRAN program listing of FIG. 13. The data from the deviometer may be presented on the digital plotter 86 or the line printer 88, or both. The digital mineral logging system 10 may also provide a plot of the ore grade calculation as well as an analysis of the ore grade using selected cutoff values. The Gamma Log program developed by the Atomic Energy Commission is well known in the mineral logging industry and may be used to program the computer 78 to perform such an ore grade analysis.

Although a preferred embodiment of the invention has been illustrated in the accompanying drawings and described in the foregoing detailed description, it will be understood that the present invention is not limited to the embodiment disclosed, but it is capable of numerous modifications without departing from the spirit of the invention. In particular, the selection and arrangement of sensors in a mineral logging tool is capable of numerous rearrangements, modifications and substitutions of sensors without departing from the spirit of the invention. In addition, the rate at which a digital signal processor samples data from the logging tool, rate of transmitting the data and the transmission system may be modified without departing from the spirit of the invention.

What is claimed is:

1. A stabilized fluxgate magnetometer, circuit, comprising:
    a fluxgate sensor having a ring core, a drive winding for the core excited by a frequency generator, and a sense winding differentially wound about the ring core for sensing the component of the earth's magnetic field normal to said sense winding;
    means for demodulating the output signal from said sense winding to produce a rectified DC signal having a polarity and magnitude determined by the phase and amplitude of the output signal from said sense winding;
    means for integrating said rectified DC signal to provide the phase stability and memory for the magnitude of current to eliminate the earth's field to indicate the direction and magnitude of the component of the earth's magnetic field normal to said sense winding;
    an operational amplifier driven by said integrating means for feeding a DC current signal back to the output of said sense winding in a direction and magnitude determined by said demodulating means to eliminate the effect of the earth's magnetic field, such that the fluxgate magnetometer is stabilized in operation at a null point;
    resonating circuit means for resonating in response to the second harmonic output signal from said sense winding;
    means for filtering and amplifying the second harmonic output signal from said sense winding;
    a phase shifting circuit for providing a signal at twice the frequency of the signal to the drive winding and in phase with the output signal from said sense winding; and
    a synchronous demodulator for beating the filtered second harmonic output signal from said resonating circuit means with the output signal from said phase shifting circuit for providing a rectified DC output signal to said integrating circuit means.

2. A stabilized fluxgate magnetometer for use in measuring one of the three mutually onthogonal components of the earth's magnetic field taken with respect to the central axis of a tool housing the magnetometer, comprising:
    a fluxgate sensor having a ring core with a toroidal drive winding and a differential sense winding about the core for sensing the difference in saturation due to the component of earth's magnetic field normal to said differential sense winding;
    an oscillator and a driver for exciting said winding drive winding of said fluxgate sensor;
    a phase shifting circuit connected to said oscillator and driver for providing an output signal twice the frequency of the signal to said drive windings;
    a second harmonic tuning element responsive to the output of said sense winding;
    circuit means for filtering and amplifying the output signal from said second harmonic tuning element to said synchronous demodulators whereby signal offsets from the output signal of said sense winding are reduced;
    a synchronous demodulator for multiplying the second harmonic signal from said tuning element by an in phase second harmonic reference signal from said phase shifting circuit for providing an error signal having a polarity and magnitude determined by the phase and amplitude of the output signal from said sense winding as the output;
    means for integrating the error signal from said synchronous demodulator to provide the phase stability and memory for the magnitude of current to eliminate the earth's field; and
    a high impedance current source driven by said integrating circuit means which sums a DC current signal into the output of said fluxgate sense winding in a direction and magnitude determined by said synchronous demodulator to eliminate the effect of the earth's field in the sensor.

3. An improved fluxgate magnetometer for operating at a stabilized point including an oscillator and a driver, a fluxgate ring core sensor and a drive coil excited by the oscillator and driver, a sense winding differentially would around said core for sensing the difference in saturations of the earth's flux linkages in the core and circuit means for determining the polarity and magnitude of an error signal to be fed through the sense winding to eliminate the earth's field in the sensor for operating the magnetometer at a stabilized null point, wherein the improvement comprises:
    means for integrating the error signal to be fed through the sensor to provide the phase stability and memory for the magnitude of current to eliminate the earth's field, and
    high impedance current source driven by said integrating means for summing a DC current into the output of the sense winding in a direction and magnitude determined by the error signal circuit means to eliminate the effect of the earth's field in the fluxgate sensor to improve the operational stability of the magnetometer by operating at a null point.

4. The improved fluxgate magnetometer of claim 3, wherein said high impedance current source is an operational amplifier.

* * * * *